(12) United States Patent
Zhang et al.

(10) Patent No.: US 9,006,867 B2
(45) Date of Patent: Apr. 14, 2015

(54) MONITORING STRUCTURE AND MONITORING METHOD FOR SILICON WET ETCHING DEPTH

(71) Applicant: CSMC Technologies FAB1 Co., Ltd., Jiangsu (CN)

(72) Inventors: Xinwei Zhang, Jiangsu (CN); Changfeng Xia, Jiangsu (CN); Chengjian Fan, Jiangsu (CN); Wei Su, Jiangsu (CN)

(73) Assignee: CSMC Technologies Fabi Co., Ltd., Jiangsu (CN)

( * ) Notice: Subject to any disclaimer, the term of this patent is extended or adjusted under 35 U.S.C. 154(b) by 0 days.

(21) Appl. No.: 14/364,933

(22) PCT Filed: Nov. 20, 2012

(86) PCT No.: PCT/CN2012/084868
§ 371 (c)(1),
(2) Date: Jun. 12, 2014

(87) PCT Pub. No.: WO2013/086920
PCT Pub. Date: Jun. 20, 2013

(65) Prior Publication Data
US 2014/0346647 A1 Nov. 27, 2014

(30) Foreign Application Priority Data
Dec. 13, 2011 (CN) .......................... 2011 1 0413966

(51) Int. Cl.
*H01L 21/66* (2006.01)
*H01L 21/306* (2006.01)
*H01L 21/308* (2006.01)

(52) U.S. Cl.
CPC .......... *H01L 22/30* (2013.01); *H01L 21/30608* (2013.01); *H01L 22/12* (2013.01); *H01L 21/3083* (2013.01)

(58) Field of Classification Search
CPC ...... H01L 22/30; H01L 22/12; H01L 21/3083
USPC .............................................. 257/622; 438/8
See application file for complete search history.

(56) References Cited

U.S. PATENT DOCUMENTS

| 5,601,954 | A | * | 2/1997 | Krivokapic et al. | .............. 430/5 |
| 6,013,396 | A | | 1/2000 | Capodieci | |
| 6,982,043 | B1 | * | 1/2006 | Subramanian et al. | ......... 216/48 |
| 2003/0052084 | A1 | * | 3/2003 | Tabery et al. | .................... 216/59 |
| 2007/0077723 | A1 | * | 4/2007 | Ahn | .............................. 438/424 |

FOREIGN PATENT DOCUMENTS

| CN | 1217469 A | 5/1999 |
| CN | 102130214 A | 7/2011 |
| JP | 11-26428 A | 1/1999 |
| JP | 2007142228 A | 6/2007 |

* cited by examiner

*Primary Examiner* — Luan C Thai
(74) *Attorney, Agent, or Firm* — Muncy, Geissler, Olds & Lowe, P.C.

(57) ABSTRACT

A monitoring structure and a relevant monitoring method for the silicon wet etching depth are provided. The structure includes a wet etched groove formed on a monocrystalline silicon material with at least two top surfaces thereof being rectangular; and the top surface widths of the grooves are $W_u$ and $W_1$ respectively, $W_u = d_u/0.71$, and $W_1 = d_1/0.71$, where $d_u$ is the maximum wet etching depth to be monitored, and $d_1$ is the minimum of the wet etching depth to be monitored. The method includes: performing anisotropic wet etching on a monocrystalline silicon wafer according to a pattern with a monitoring pattern, forming an etched groove to be monitored and a structure for monitoring the depth of the groove, and then monitoring the structure to monitor the wet etching depth. The etching depth of the groove can be monitored with low costs, and a higher monitoring accuracy is obtained.

20 Claims, 5 Drawing Sheets

MONITORING STRUCTURE AND MONITORING METHOD FOR SILICON WET ETCHING DEPTH

FIELD OF THE INVENTION

The present invention relates to wet-etching technologies, more particularly relates to a monitoring structure and relevant monitoring method for silicon wet etching depth in the wet-etching technologies, which relates to the semiconductor manufacturing field.

BACKGROUND OF THE INVENTION

Etching process includes dry etching and wet etching. The dry etching may bring plasma damages to the sensitive devices on the silicon wafer. Currently, the wet etching plays an important role in the semiconductor manufacturing field. The anisotropic wet etching of silicon has been very popular in the wet etching. The anisotropic etchant is generally divided into organic etchant and inorganic etchant. The organic etchant includes EPW (ethylenediamine, pyrocatechol and water), hydrazine, TMAH, and so on; the inorganic etchant includes alkaline etching solution such as KOH, NaOH, $NH_4OH$, and so on. During the process of the anisotropic wet etching of silicon, the different crystal orientations of the silicon have different etching rates, i.e. the etching rate is closely related to the crystal orientation of the silicon. In addition, the anisotropic etching rate of silicon is also related to the type and ratio of the etchant, the reaction temperature and other parameters. Therefore, the fluctuation of the etching rate may be great, that is difficult to control the etching depth. In the semiconductor device, the slight difference of the size of the device affects the device performance. Therefore, it is important to use effective means to monitor the silicon wet etching depth.

Currently, there are several ways to monitor the silicon wet etching depth. First, a microscope with a depth (Z axis) measuring is used to measure the depth; second, 3D profilometer or scanner is used to measure the depth. In which, the first way has a relatively low accuracy, the error is usually beyond 10 μm; especially, the accuracy is much lower when the etching depth is very deep (such as several hundred microns). Moreover, the microscope with the depth (Z axis) measuring is very expensive. It has a high accuracy of the second way, but dedicated measurement equipments are needed, such dedicated equipments are usually quite expensive. Moreover, in both of the above measurement ways, the etching sheet is needed to remove for several times during the etching process, and then the etching area is measured, thus the etching depth is monitored. Plenty of time and manpower are cost for every measurement step; the production efficiency is seriously affected.

Accordingly, it is necessary to provide a monitoring method with low-cost, which can control the silicon wet etching depth.

SUMMARY OF THE INVENTION

It is an object of the present invention to provide a monitoring structure of silicon wet etching depth and a relevant monitoring method thereof.

In order to solve the above problem, the present invention provides the following technical solution:

A structure of monitoring silicon wet etching depth includes at least two wet etching grooves defined on a monocrystalline silicon material. Etch top surface of the wet etching groove is rectangular, top surface widths of the at least two wet etching grooves are $W_u$ and $W_1$, respectively, $W_u=d_u/0.71$, $W_1=d_1/0.71$. $d_u$ is the maximum wet etching depth to be monitored, $d_1$ is the minimum wet etching depth to be monitored.

Preferably, an etching surface of the monocrystalline silicon material is a crystal face (100).

Preferably, the number of the wet etching grooves is n, n≥3.

Preferably, the top surface widths of n wet etching grooves are greater than or equal to $W_1$ and less than or equal to $W_u$.

Preferably, the n wet etching grooves are arranged according to top surface widths in ascending order from $W_1$ to $W_u$.

Preferably, the n wet etching grooves are arranged closely.

A mask plate having monitoring pattern of silicon wet etching depth includes a monitoring pattern. The monitoring pattern includes at least two rectangular windows for wet etching; widths of the at least two windows are $W_u$ and $W_1$, respectively; $W_u=d_u/0.71$, $W_1=d_1/0.71$; $d_u$ is the maximum wet etching depth to be monitored, $d_1$ is the minimum wet etching depth to be monitored.

Preferably, the number of the windows is n, n≥3.

Preferably, widths of n windows are greater than or equal to $W_1$ and less than or equal to $W_u$.

Preferably, the n windows are arranged according to widths in ascending order from $W_1$ to $W_u$.

Preferably, the n windows are arranged closely.

A method of monitoring silicon wet etching depth includes the steps of:

step one, adding a monitoring pattern to a layout, wherein the monitoring pattern comprises: at least two rectangular windows for wet etching; widths of the at least two windows are $W_u$ and $W_1$, respectively; $W_u=d_u/0.71$, $W_1=d_1/0.71$; $d_u$ is the maximum wet etching depth to be monitored, $d_1$ is the minimum wet etching depth to be monitored;

step two, anisotropic wet etching a monocrystalline silicon wafer according to the layout having the monitoring pattern, and forming an etching groove needed to be monitored and a monitoring structure configured to monitor a depth of the etching groove; the monitoring structure is formed by etching according to the monitoring pattern, the monitoring structure comprises at least two wet etching grooves with top surface widths of $W_u$ and $W_1$, respectively;

step three, monitoring the monitoring structure in the step two or after the step two of wet etching, determining an actual etching depth range of the etching groove needed to be monitored according to a monitoring result, thus performing the monitoring of the wet etching depth;

the step of determining the actual etching depth range of the etching groove needed to be monitored according to the monitoring result includes:

when bottoms of the wet etching grooves with top surface widths of $W_u$ and $W_1$ are planar structures, then determining the actual etching depth $d_{actual}$ of the etching grooves needed to be monitored is less than $d_1$;

when a bottom of the wet etching groove with the top surface width of $W_u$ is a planar structure, while a bottom of the wet etching groove with the top surface width of $W_1$ is a linear structure, then determining the actual etching depth $d_{actual}$ of the etching grooves needed to be monitored is greater than or equal to $d_1$ and less than $d_u$; and when bottoms of the wet etching grooves with top surface widths of $W_u$ and $W_1$ are linear structures, then determining the actual etching depth $d_{actual}$ of the etching grooves needed to be monitored is greater than or equal to $d_u$.

Preferably, the number of the windows in the monitoring pattern is n, n≥3.

Preferably, widths of n windows are greater than or equal to $W_1$ and less than or equal to $W_u$.

Preferably, the n windows are arranged according to widths in ascending order from $W_1$ to $W_u$.

Preferably, the n windows are arranged closely.

Preferably, when the number of the windows in the monitoring pattern is n, n≥3, if a bottom of the wet etching groove with a top surface width of $W_x$ is a planar structure, while a bottom of the wet etching groove with a top surface width of $W_y$ is a linear structure, then determining the actual etching depth $d_{actual}$ of the etching grooves needed to be monitored is greater than or equal to $d_y$ and less than $d_x$; $d_x=0.71 W_x$, $d_y=0.71 W_y$.

Preferably, an etching surface of the monocrystalline silicon wafer is a crystal face (100).

Preferably, an anisotropic etchant is used in the wet etching with a rate on the silicon (100) crystal face faster than that on a silicon crystal face (111).

Preferably, a microscope is used to monitor the monitoring structure in the step three.

The advantage of the present invention are shown as follows:

The characteristics of silicon anisotropic wet etching are utilized cleverly in the technical solution of the present invention. The appropriate monitoring pattern is designed according to the requirements of the etching depth of the product. The monitoring structure and the etching groove of the product are formed at the same time; thus the etching depth of the etching groove of the product can be monitored intuitively and easily via monitoring the monitoring structure. The common microscope with low cost can be used to monitor the monitoring structure; it is easy to operate and has higher monitoring accuracy.

BRIEF DESCRIPTION OF THE DRAWINGS

FIG. 1a-1b are schematic views of a trapezoidal etching groove of an embodiment of the present invention, in which FIG. 1a is a plan view, FIG. 1b is a cross-sectional view;

FIG. 2a-2b are schematic views of a V-groove of an embodiment of the present invention, in which FIG. 2a is a plan view, FIG. 2b is a cross-sectional view;

DETAILED DESCRIPTION OF THE EMBODIMENTS

The invention will be described in detail with the following embodiments and drawings, which are not shown to scale for convenience.

The inventors of the present invention have made a thorough study to the anisotropic wet etching of the monocrystalline silicon materials, and found that, because the physical properties of the monocrystalline silicon are different in the different directions, the etching rates of some etchants for each crystal face of the monocrystalline silicon are different. Typically, the etching rate on silicon crystal face (100) is very fast, while the etching rate on crystal face (111) is very slow.

Figure 1A:
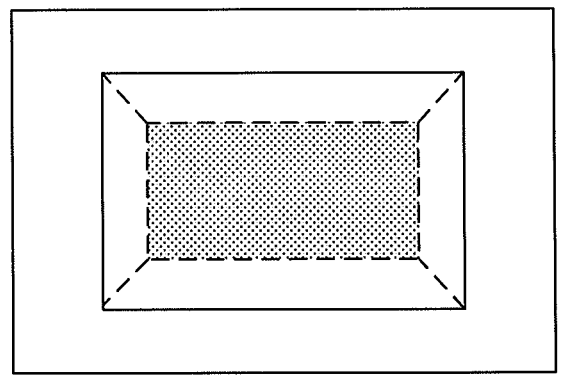
Figure 1B:
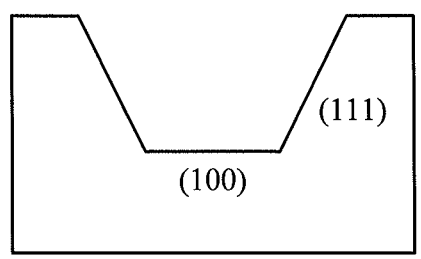
Figure 2A:
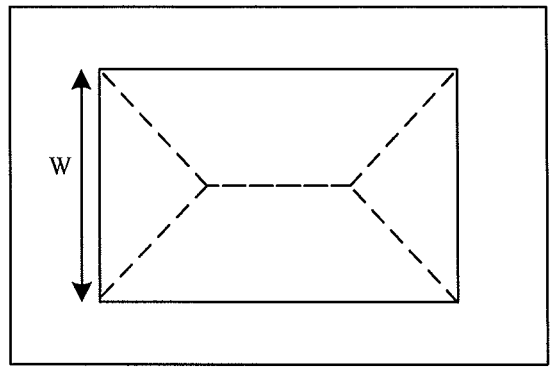
Figure 2B:
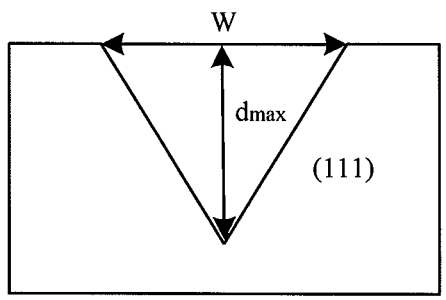

Taking a wet etching process using KOH or TMAH etchant for etching monocrystalline silicon wafer as an example, a trapezoidal etching groove is defined as shown in FIG. 1a and FIG. 1b after etching for a period of time. A side wall of the etching groove is not vertical to the crystal face (100) of the bottom surface, but inwardly inclines along the crystal face (111). If the monocrystalline silicon wafer is further etched, the side wall of the etching groove will be further extended along the crystal face (111) and downward until the V-groove shown as FIG. 2a and FIG. 2b is defined, the bottom surface is changed from planar structure to linear structure. The angle between the silicon crystal face (100) and the crystal face (111) is 54.74 degree, thus a relationship between an opening size W and an etching depth $d_{max}$ of the V-shaped groove can be calculated as follow: $d_{max}=0.5 \times W \times \tan(54.74) \approx 0.71 W$.

Using the feature that the relationship between the opening size W and the etching depth $d_{max}$ of the V-shaped groove meets $d_{max} \approx 0.71 W$, the inventor of the present invention designs an appropriate monitoring pattern based on the requirements of the etching depth, thus the silicon wet etching depth can be monitored visually.

EXAMPLE ONE

Referring to FIG. 3a, FIG. 3b to FIG. 6a and FIG. 6b, the specific process of this embodiment is shown as follows:

If the desired etching depth of the product is d, the depth needs to be controlled is between $d_u$ and $d_1$, in other words, $d_u$ is the maximum wet etching depth needed to be monitored, $d_1$ is the minimum wet etching depth needed to be monitored, i.e. $d_u \geq d \geq d_1$.

Figure 3A:
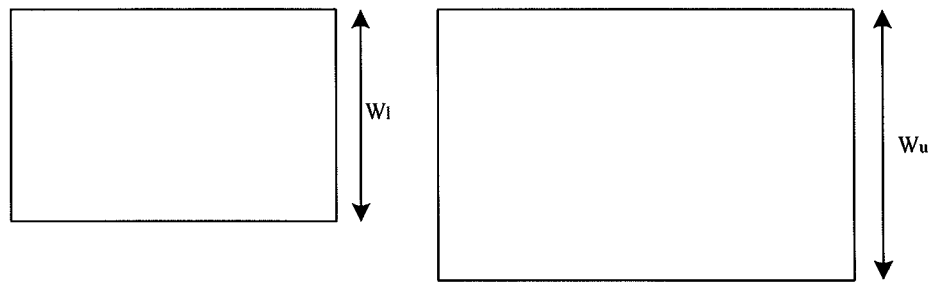
FIG. 3a is a schematic view of a monitoring pattern of a product layout of a first embodiment of the present invention.
Figure 3B:
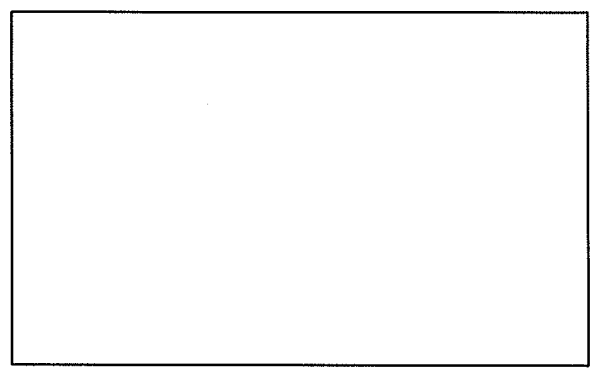
FIG. 3b is a schematic view of product pattern of the product layout of the first embodiment of the present invention.

Step one, firstly, the corresponding opening size $W_u$ and $W_1$ are calculated according to the $d_u$ and $d_1$, that is $W_u=d_u/0.71$, $W_1=d_1/0.71$; and then the rectangular etching windows with widths of $W_u$ and $W_1$ are designed respectively; the corresponding etching depths of the V-shaped grooves are $d_u$ and $d_1$, respectively. These two rectangular etching windows are arranged in the product layout to be used as the monitoring patterns. The monitoring patterns in the product layout are shown in FIG. 3a; the product patterns needed to be monitored are shown in FIG. 3b. Then, a mask is made according to the product layout.

Step two, the monocrystalline silicon wafer is anisotropic wet etched according to the product layout with the monitoring pattern. Usually, the mask is made on the monocrystalline silicon wafer; the pattern on the product layout is transferred to the mask by a mask plate using a photolithography process; then the monocrystalline silicon wafer with the mask is etched in an anisotropic etchant. The anisotropic etchant has an etching rate on the silicon crystal face (100) faster than that on the silicon crystal face (111). Preferably, the anisotropic etchant is KOH solution or TMAH solution, the monocrystalline silicon wafer is the monocrystalline silicon wafer with a surface of crystal face (100) (i.e. etching face). A monitoring structure for monitoring the depth of the etching groove and the etching groove needed to be monitored are formed by etching on the monocrystalline silicon wafer. The monitoring structure is etched according to the monitoring pattern; the monitoring structure includes two wet etching grooves with widths of $W_u$ and $W_1$, respectively. The etching grooves needed to be monitored are etched according to the product pattern.

Step three, in the wet etching process of the step two or after the wet etching process of the step two, a microscope can be used to monitor the monitoring structure, the actual etching depth range of the etching groove is determined according to monitoring results, thus the wet etching depth is monitored.

Figure 4:
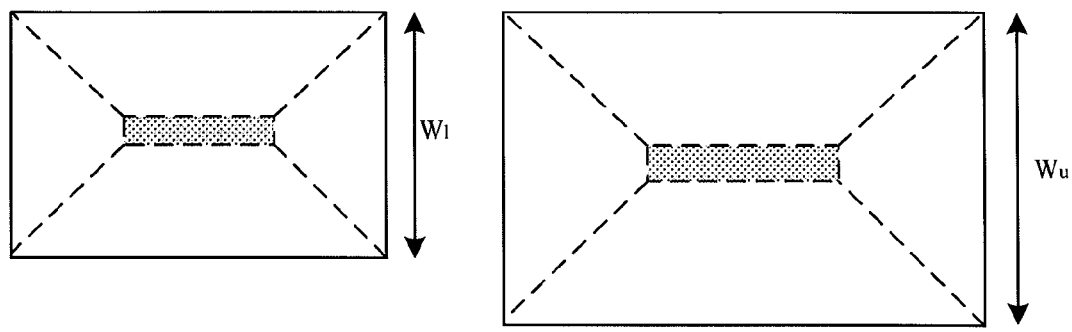
FIG. 4 is a schematic view of a monitoring structure of a first circumstance of the first embodiment of the present invention.

The monitoring results can be divided into three circumstances, the actual etching depth range of the etching groove is determined according to the three circumstances, respectively, the specific determination methods are shown as follows:

In the first circumstance, referring to FIG. 4, when the bottoms of the wet etching grooves with the top surface widths of $W_u$ and $W_1$ are planar structures, namely, the V-shaped groove is not formed, then it can be determined that the actual etching depth of the etching groove needed to be monitored meets the relationship of $d_{actual} < d_1$.

Figure 5:
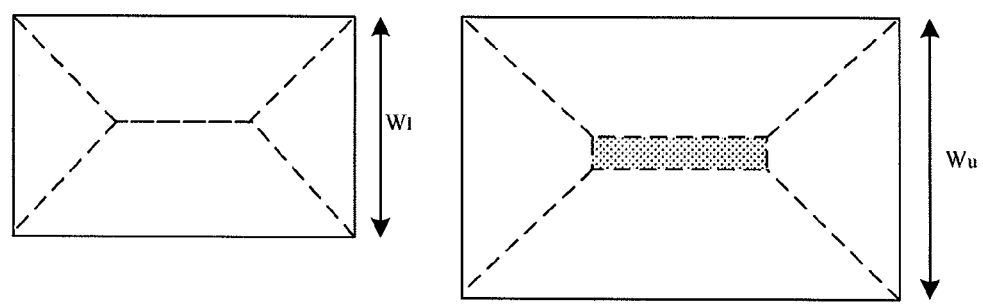
FIG. 5 is a schematic view of a monitoring structure of a second circumstance of the first embodiment of the present invention.

In the second circumstance, referring to FIG. 5, when the bottom of the wet etching groove with the top surface width of $W_u$ is a planar structure, while the bottom of the wet etching groove with the top surface width of $W_1$ is a linear structure; namely, the V-shaped groove with the top surface width of $W_1$ is formed, then it can be determined that the actual etching depth of the etching groove needed to be monitored meets the relationship of $d_u > d_{actual} \geq d_1$.

Figure 6:
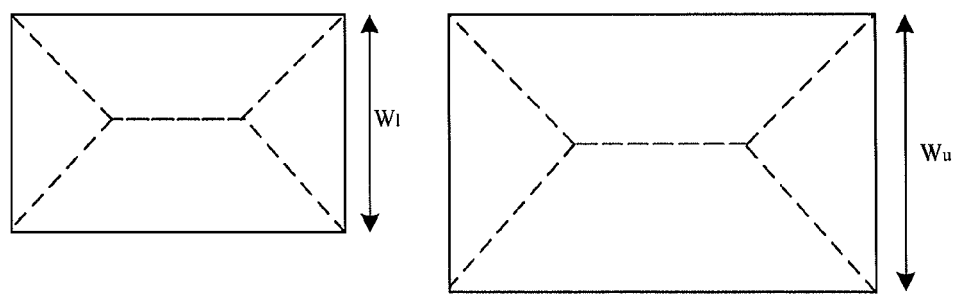
FIG. 6 is a schematic view of a monitoring structure of a third circumstance of the first embodiment of the present invention.

In the third circumstance, referring to FIG. 6, when the bottoms of the wet etching grooves with the top surface widths of $W_u$ and $W_1$ are linear structures, namely, the two V-shaped grooves are formed, then it can be determined that the actual etching depth of the etching groove needed to be monitored meets the relationship of $d_{actual} \geq d_u$.

Accordingly, whether the depth of the etching meets the requirements can be monitored by observing the microscope.

EXAMPLE TWO

The steps of this embodiment are similar to those of the first embodiment, the differences are: in order to more accurately determine the etching depth, when designing the monitoring pattern, the number of windows in the monitoring patterns is increased, such as three or more windows are provided, the widths of all the windows are in the range of greater than or equal to $W_1$ and less than or equal to $W_u$.

For example, when the number of the windows in the monitoring pattern is n, n≥3, if the bottom of the wet etching groove with the top surface width $W_x$ is a planar structure, while the bottom of the wet etching groove with the top surface width of $W_y$ is a linear structure, then it can be determined that the actual etching depth of the etching groove needed to be monitored meets the relationship of $d_x > d_{actual} \geq d_y$; in which, $d_x = 0.71 W_x$, $d_y = 0.71 W_y$, $W_u \geq W_x \geq W_1$, $W_u \geq W_y \geq W_1$.

Preferably, these windows are closely arranged in width in an ascending order from $W_1$ to $W_u$, so that the difference in size between two adjacent patterns can be reduced, and the observer can compare and judge more easily and accurately when the microscopic is used for observation.

Figure 7:
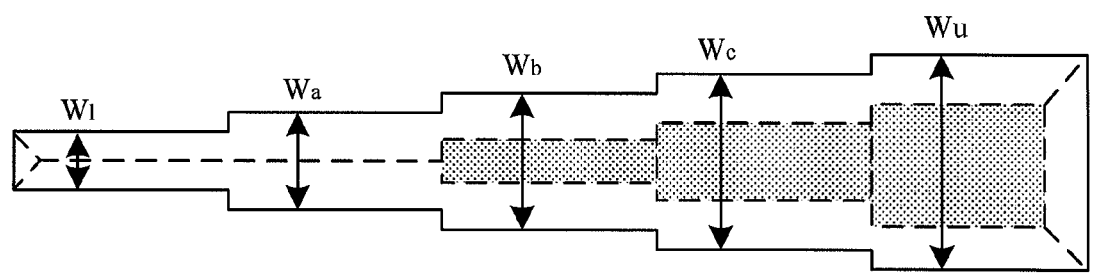
FIG. 7 is a schematic view of a monitoring structure of a second embodiment of the present invention.

For example, $W_a$, $W_b$, $W_c$ can be inserted in the range of from $W_1$ to $W_u$, the monitoring structure is shown in FIG. 7, in which, the bottom of the wet etching groove with the top surface width of $W_b$ is a planar structure, the bottom of the wet etching groove with the top surface width of $W_a$ is a linear structure, then it can be determined that the actual etching depth of the etching groove needed to be monitored meets the relationship of $d_b > d_{actual} \geq d_a$.

It should be understood that, the etching groove needed to be monitored and the monitoring structure can be formed on the wafer using the layout with the monitoring pattern according to the technical solution of the present invention, so that the monitoring structure and the etching groove are formed on the same wafer, which is conducive to the accuracy of the monitoring. It is to be understood that, the monitoring structure can also be made individually on a slice according to the invention. For example, based on the monitoring pattern and the product pattern, the slice and the wafer are etched in the etchant at the same time, so that the monitoring structure is formed on the accompanying wafer, the etching groove is formed on the wafer. The monitoring of the etching groove can also be performed by monitoring the accompanying wafer only with the monitoring structure.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A structure of monitoring silicon wet etching depth, comprising:
   at least two wet etching grooves defined on a monocrystalline silicon material, wherein etch top surface of the wet etching groove is rectangular, top surface widths of the at least two wet etching grooves are $W_u$ and $W_1$, respectively, $W_u = d_u/0.71$, $W_1 = d_1/0.71$; wherein $d_u$ is the maximum wet etching depth to be monitored, $d_1$ is the minimum wet etching depth to be monitored.

2. The structure of monitoring silicon wet etching depth according to claim 1, wherein an etching surface of the monocrystalline silicon material is a crystal face (100).

3. The structure of monitoring silicon wet etching depth according to claim 1, wherein the number of the wet etching grooves is n, n>3.

4. The structure of monitoring silicon wet etching depth according to claim 3, wherein the top surface widths of n wet etching grooves are greater than or equal to $W_1$ and less than or equal to $W_u$.

5. The structure of monitoring silicon wet etching depth according to claim 4, wherein the n wet etching grooves are arranged according to top surface widths in ascending order from $W_1$ to $W_u$.

6. The structure of monitoring silicon wet etching depth according to claim 3, wherein the n wet etching grooves are arranged closely.

7. A mask plate having monitoring pattern of silicon wet etching depth, comprising a monitoring pattern, wherein the monitoring pattern comprises at least two rectangular windows for wet etching; widths of the at least two windows are $W_u$ and $W_1$, respectively; $W_u = d_u/0.71$, $W_1 = d_1/0.71$; $d_u$ is the maximum wet etching depth to be monitored, $d_1$ is the minimum wet etching depth to be monitored.

8. The mask plate having monitoring pattern of silicon wet etching depth according to claim 7, wherein the number of the windows is n, n>3.

9. The mask plate having monitoring pattern of silicon wet etching depth according to claim 8, wherein widths of n windows are greater than or equal to $W_1$ and less than or equal to $W_u$.

10. The mask plate having monitoring pattern of silicon wet etching depth according to claim 9, wherein the n windows are arranged according to widths in ascending order from $W_1$ to $W_u$.

11. The mask plate having monitoring pattern of silicon wet etching depth according to claim 8, wherein the n windows are arranged closely.

12. A method of monitoring silicon wet etching depth, comprising the steps of:
step one, adding a monitoring pattern to a layout, wherein the monitoring pattern comprises: at least two rectangular windows for wet etching; widths of the at least two windows are $W_u$ and $W_1$, respectively; $W_u=d_u/0.71$, $W_1=d_1/0.71$; $d_u$ is the maximum wet etching depth to be monitored, $d_1$ is the minimum wet etching depth to be monitored;
step two, anisotropic wet etching a monocrystalline silicon wafer according to the layout having the monitoring pattern, and forming an etching groove needed to be monitored and a monitoring structure configured to monitor a depth of the etching groove; in which, the monitoring structure is formed by etching according to the monitoring pattern, the monitoring structure comprises at least two wet etching grooves with top surface widths of $W_u$ and $W_1$, respectively;
step three, monitoring the monitoring structure in the step two or after the step two of wet etching, determining an actual etching depth range of the etching groove needed to be monitored according to a monitoring result, thus performing the monitoring of the wet etching depth;
wherein the step of determining the actual etching depth range of the etching groove needed to be monitored according to the monitoring result comprises:
when bottoms of the wet etching grooves with top surface widths of $W_u$ and $W_1$ are planar structures, then determining the actual etching depth $d_{actual}$ of the etching grooves needed to be monitored is less than $d_1$;
when a bottom of the wet etching groove with the top surface width of $W_u$ is a planar structure, while a bottom of the wet etching groove with the top surface width of $W_1$ is a linear structure, then determining the actual etching depth $d_{actual}$ of the etching grooves needed to be monitored is greater than or equal to $d_1$ and less than $d_u$; and
when bottoms of the wet etching grooves with top surface widths of $W_u$ and $W_1$ are linear structures, then determining the actual etching depth $d_{actual}$ of the etching grooves needed to be monitored is greater than or equal to $d_u$.

13. The method of monitoring silicon wet etching depth according to claim 12, wherein the number of the windows in the monitoring pattern is n, n>3.

14. The method of monitoring silicon wet etching depth according to claim 13, wherein widths of n windows are greater than or equal to $W_1$ and less than or equal to $W_u$.

15. The method of monitoring silicon wet etching depth according to claim 14, wherein the n windows are arranged according to widths in ascending order from $W_1$ to $W_u$.

16. The method of monitoring silicon wet etching depth according to claim 13, wherein the n windows are arranged closely.

17. The method of monitoring silicon wet etching depth according to claim 13, wherein when the number of the windows in the monitoring pattern is n, n>3, if a bottom of the wet etching groove with a top surface width of $W_x$ is a planar structure, while a bottom of the wet etching groove with a top surface width of $W_y$ is a linear structure, then determining the actual etching depth $d_{actual}$ of the etching grooves needed to be monitored is greater than or equal to $d_y$ and less than $d_x$; $d_x=0.71W_x$, $d_y=0.71W_y$.

18. The method of monitoring silicon wet etching depth according to claim 12, wherein an etching surface of the monocrystalline silicon wafer is a crystal face (100).

19. The method of monitoring silicon wet etching depth according to claim 12, wherein an anisotropic etchant is used in the wet etching with a rate on the silicon crystal face (100) faster than that on a silicon crystal face (111).

20. The method of monitoring silicon wet etching depth according to claim 12, wherein a microscope is used to monitor the monitoring structure in the step three.

\* \* \* \* \*